United States Patent
Hsieh

(10) Patent No.: US 10,685,969 B2
(45) Date of Patent: Jun. 16, 2020

(54) READ-ONLY MEMORY (ROM) DEVICE STRUCTURE AND METHOD FOR FORMING THE SAME

(71) Applicant: Taiwan Semiconductor Manufacturing Co., Ltd., Hsinchu (TW)

(72) Inventor: Chih-Hung Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/946,104

(22) Filed: Apr. 5, 2018

(65) Prior Publication Data

US 2018/0233508 A1 Aug. 16, 2018

Related U.S. Application Data

(63) Continuation of application No. 15/261,282, filed on Sep. 9, 2016, now Pat. No. 9,941,290.

(60) Provisional application No. 62/344,226, filed on Jun. 1, 2016.

(51) Int. Cl.
*H01L 27/092* (2006.01)
*H01L 27/112* (2006.01)
*H01L 27/02* (2006.01)
*H01L 29/66* (2006.01)
*H01L 29/49* (2006.01)

(52) U.S. Cl.
CPC .... *H01L 27/11273* (2013.01); *H01L 27/0207* (2013.01); *H01L 27/092* (2013.01); *H01L 27/11246* (2013.01); *H01L 29/66545* (2013.01); *H01L 29/4966* (2013.01)

(58) Field of Classification Search
CPC ......... H01L 27/11273; H01L 27/11246; H01L 27/0207; H01L 27/092; H01L 29/66545; H01L 29/4966; G03G 15/0898; G03G 21/206; G03G 2221/1645; G03G 15/0942
See application file for complete search history.

(56) References Cited

U.S. PATENT DOCUMENTS

| | | | |
|---|---|---|---|
| 8,120,939 B2 | 2/2012 | Liaw | |
| 10,204,901 B2* | 2/2019 | Woo | H01L 27/0738 |
| 2006/0281250 A1* | 12/2006 | Schloesser | H01L 21/76232 438/253 |
| 2009/0045453 A1* | 2/2009 | Heo | H01L 27/115 257/324 |
| 2014/0264609 A1* | 9/2014 | Fung | H01L 21/761 257/368 |

(Continued)

*Primary Examiner* — Edward Chin
(74) *Attorney, Agent, or Firm* — Birch, Stewart, Kolasch & Birch, LLP

(57) ABSTRACT

A read-only memory (ROM) structure is provided. The ROM device structure includes a first gate structure formed over a substrate, and the first gate structure includes a first work function layer with a first thickness. The ROM device structure includes an isolation structure formed over the substrate, and the isolation structure is adjacent to the first gate structure. The isolation structure includes a second work function layer with a second thickness, and the second thickness is larger than or smaller than the first thickness. The ROM device structure also includes a first contact structure formed over the substrate, and the first contact structure is between the first gate structure and the isolation structure.

20 Claims, 18 Drawing Sheets

(56) References Cited

U.S. PATENT DOCUMENTS

2015/0380547 A1\* 12/2015 Liaw .................. H01L 29/7827
                                                    257/329
2016/0225868 A1\* 8/2016 Kim ................... H01L 29/4966
2017/0154890 A1\* 6/2017 Jin .................... H01L 27/11206

\* cited by examiner

READ-ONLY MEMORY (ROM) DEVICE STRUCTURE AND METHOD FOR FORMING THE SAME

CROSS REFERENCE TO RELATED APPLICATIONS

This Application claims the benefit of U.S. Provisional Application No. 62/344,226, filed on Jun. 1, 2016, and entitled "Read-only memory (ROM) device structure and method for forming the same", the entirety of which is incorporated by reference herein. This application is a Continuation application of U.S. patent application Ser. No. 15/261,282, filed on Sep. 9, 2016, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

A read-only memory (ROM) device structure is a non-volatile semiconductor memory device which is widely utilized in digital electronics applications. The data stored in the ROM device structure can be retained permanently even after the power is turned off.

Although existing ROM devices and methods of fabricating ROM devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
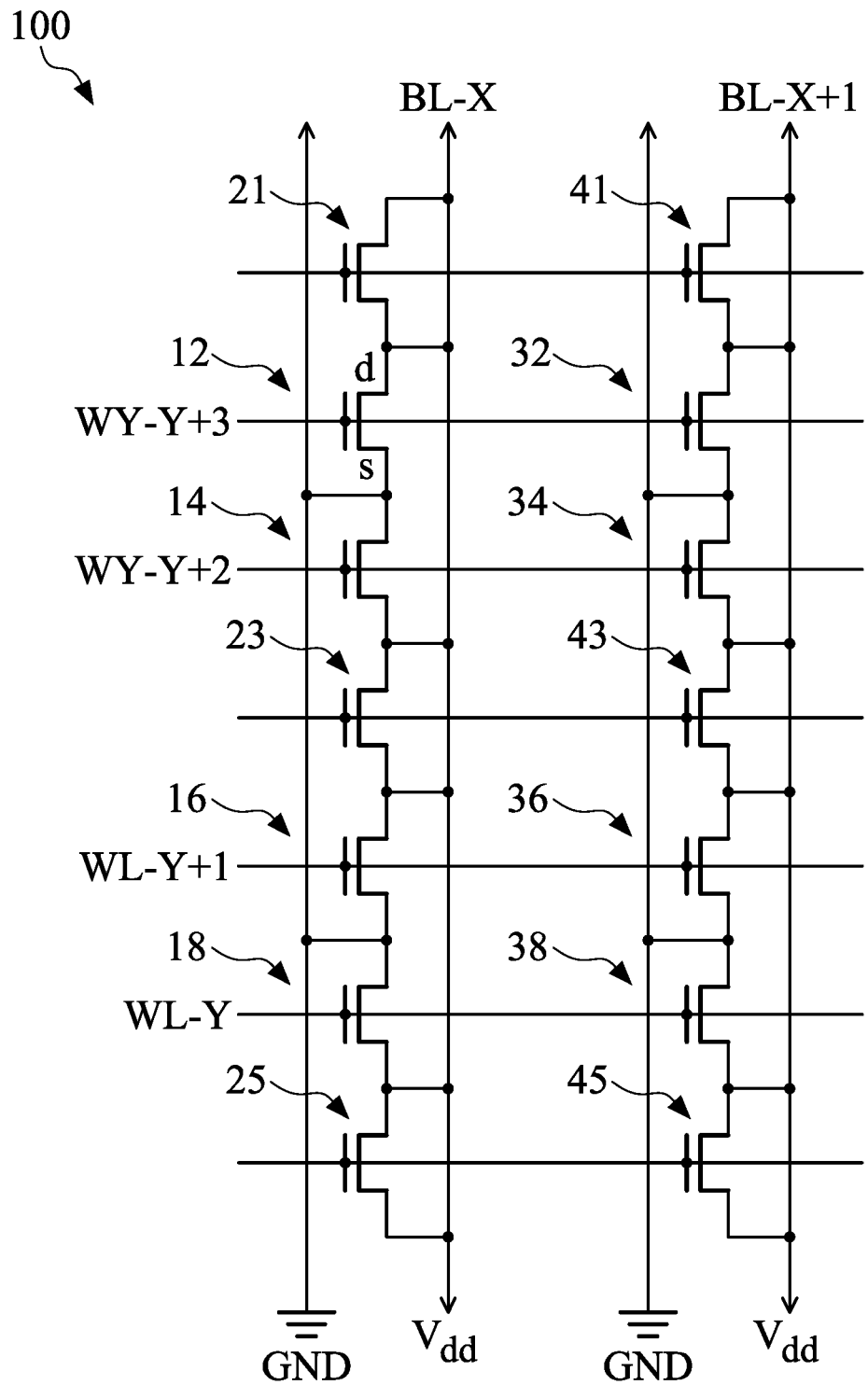
FIG. 1 shows a circuit diagram of a read-only memory (ROM) cell array, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a read-only memory (ROM) cell device structure are provided. FIG. 1 shows a circuit diagram of a read-only memory (ROM) cell array 100, in accordance with some embodiments of the disclosure. The ROM cell array 100 includes a number of rows and a number of columns. The ROM cell array 100 includes four word lines WY-Y+3, WY-Y+2, WY-Y+1 and WY-Y, two bit lines BL-X and BL-X+1, and two ground potentials GND. The ROM cell array 100 is addressed by word lines WY-Y+3, WY-Y+2, WY-Y+1 and WY-Y. Other circuit (e.g. controller) can access ROM cell array 100 through the word lines and bit lines BL-X and BL-X+1.

The ROM cell array 100 includes a first transistor 12, a second transistor 14, a third transistor 16, a fourth transistor 18, a first isolation transistor 21, a second isolation transistor 23 and a third isolation transistor 25. The gate terminals of the first transistor 12, the second transistor 14, the third transistor 16 and the fourth transistor 18 are biased from the word lines WY-Y+3, WY-Y+2, WY-Y+1 and WY-Y. A reading voltage for activating the first transistor 12, the second transistor 14, the third transistor 16 and the fourth transistor 18 is provided through the word lines WY-Y+3, WY-Y+2, WY-Y+1 and WY-Y. The drain terminal of the first transistor 12 is biased from the bit line BL-X. The source terminal of the first transistor 12 is electrically connected to the ground potential GND.

The gate terminals of the first isolation transistor 21, the second isolation transistor 23 and the third isolation transistor 25 are electrically connected to the ground potential GND. In a first bit cell, a first group of transistors includes at least two transistors, such as the first transistor 12 and the second transistor 14. In a second bit cell, a second group of transistors includes at least two transistors, such as the third transistor 16 and the fourth transistor 18. The second isolation transistor 23 is formed between the first bit cell and the second bit cell. More specifically, the second isolation transistor 23 is formed between the first group of transistors and the second group of transistors. The first isolation transistor 21, the second isolation transistor 23, and the third isolation transistor 25 are configured to electrically isolate the adjacent transistors which belong to different bit cells.

In the right side of FIG. 1, the layout of the first column is similar to that of the second column. Another four transistors 32,34,36,38 are formed next to the transistors 12,14,16,18 and two isolation transistors 41, 43, 45 are next to the isolation transistors 23, 25. The drain terminal of another four transistors 32,34,36,38 are biased from the bit line BL-X+1. The gate terminals of another four transistors 32,34,36,38 are electrically connected to the ground potential GND.

Figure 2:
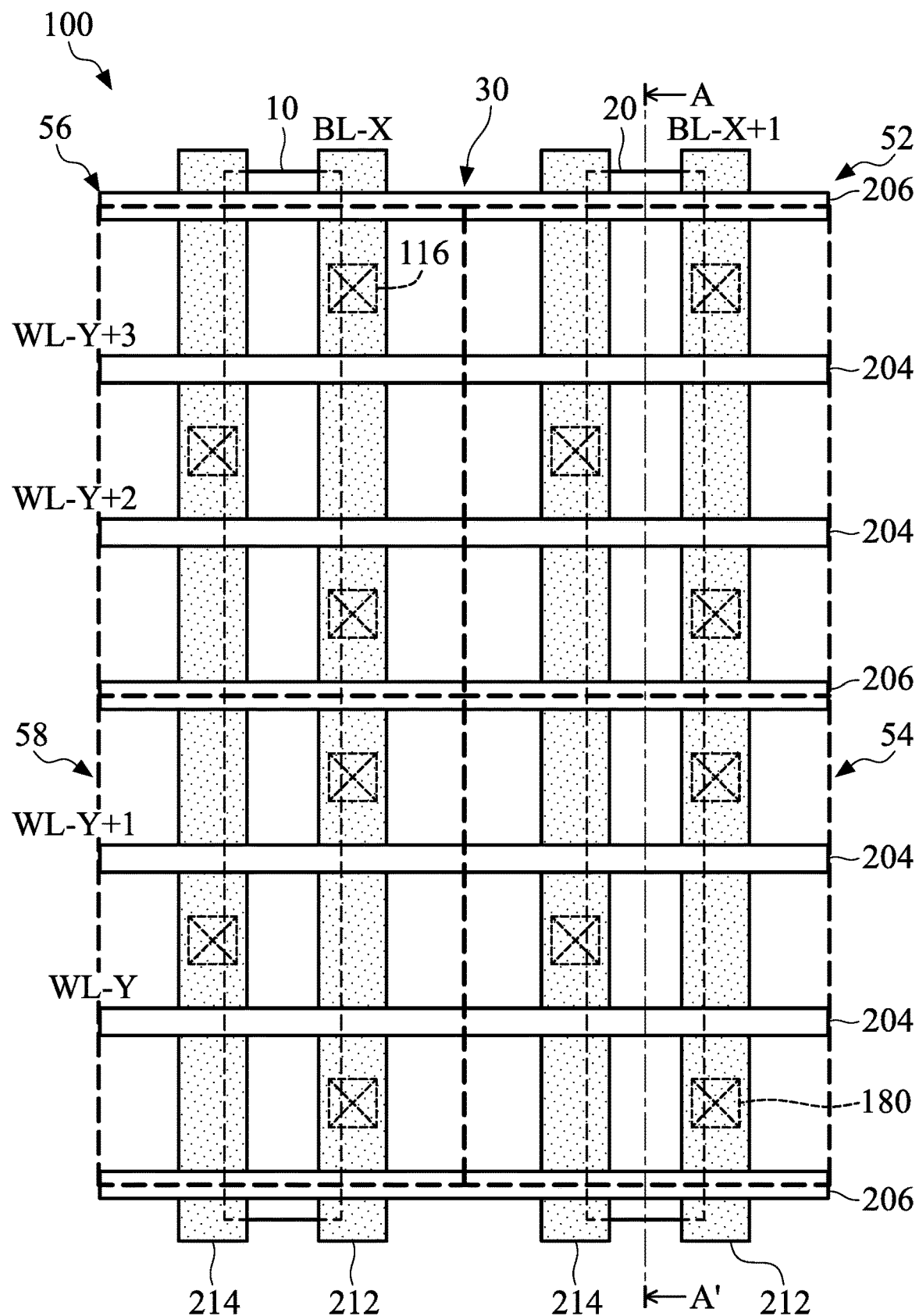
FIG. 2 shows a layout diagram of a read-only memory (ROM) cell array, in accordance with some embodiments of the disclosure.

FIG. 2 shows a layout diagram of a read-only memory (ROM) cell array 100, in accordance with some embodiments of the disclosure. The ROM cell array 100 includes a first continuous region 10 and a second continuous region 20. In some other embodiments, the first continuous region 10 has a first-type conductivity (e.g. n-type or p-type), and the second continuous region 20 has the same-type conductivity. In some other embodiments, the first continuous region 10 has a first-type conductivity (e.g. n-type or p-type), and the second continuous region 20 has a second-type conductivity opposite to the first-type conductivity.

Figure 3A:
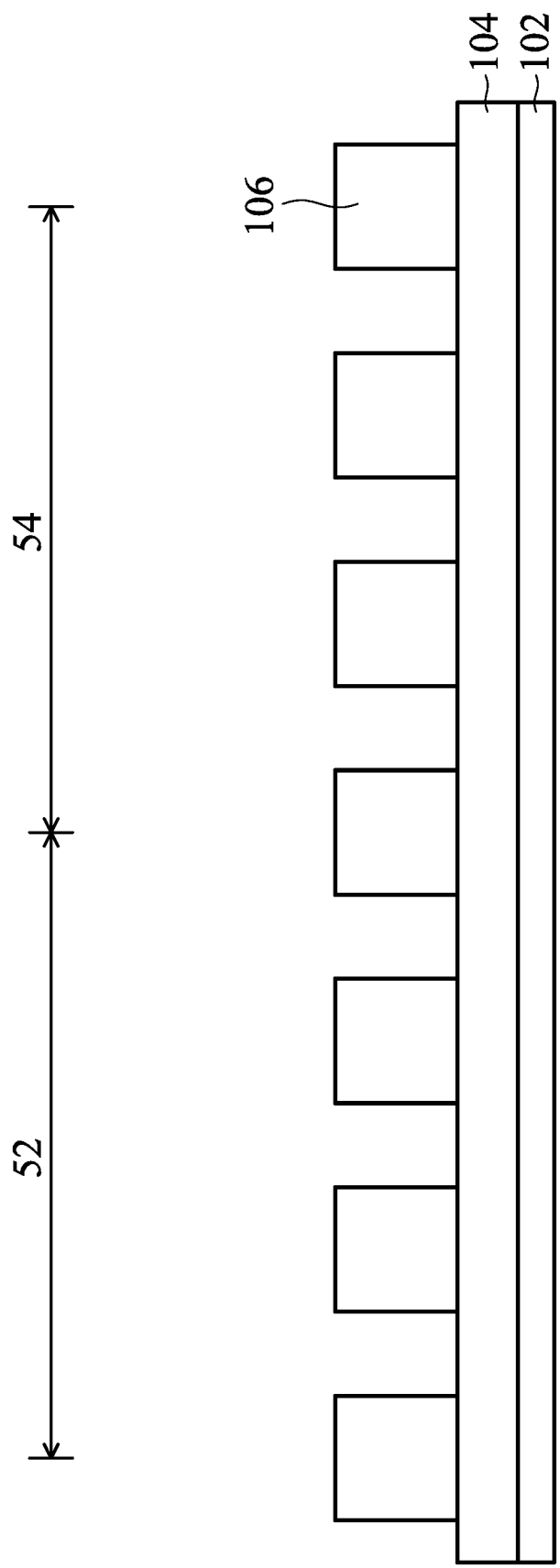
FIGS. 3A-3L show cross-sectional representations of various stages of forming read-only memory (ROM) cell array shown in FIG. 2, in accordance with some embodiments of the disclosure.

The first continuous region 10 and the second continuous region 20 are formed over a substrate 102 (shown in FIG. 3A). The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor. The bulk semiconductor may be silicon, germanium, or other suitable materials.

The first continuous region 10 and the second continuous region 20 can reduce or eliminate the use of isolation structures, such as a shallow trench isolation (STI) region. Therefore, the stress on the substrate may be reduced.

The first continuous region 10 and a second continuous region 20 are surrounded by an isolation region 30. In other words, the first continuous region 10 is insulated from the second continuous region 20 by the isolation region 30. In some embodiments, the isolation region 30 is the shallow trench isolation (STI) region.

The ROM cell array 100 further includes a number of word lines 204 and a number of isolation lines 206. The word lines 204 are shown as horizontal lines and labeled as WL-Y, WL-Y+1, WL-Y+2 and WL-Y+3.

The isolation lines 206 are shown as horizontal lines disposed between adjacent word lines 204. For example, the isolation lines 206 are disposed between the word lines WL-Y+1 and WL-Y+2, below the word line WL-Y and above the word line WL-Y+3.

The ROM cell array 100 further includes a number of bit lines 212, and a number of ground potential ($V_{SS}$) lines 214. The bit lines 212 are shown as vertical lines and labeled as BL-X and BL-X+1. The bit lines 212 are orthogonal to the word lines 204. The $V_{SS}$ lines 214 are shown as vertical lines and are orthogonal to the word lines 204. In some embodiments, the bit lines 212 are formed in a first metal layer ($M_1$) (shown in FIG. 3K) and connected to a second metal layer ($M_2$) via conductive vias 180.

The isolation transistors 21, 23, 25 controlled by the isolation lines 206 remain at all times in the "off" state. In some embodiments, the isolation structure 144a (shown in FIG. 3K) is the P-type MOS device, and the isolation lines 206 is electrically connected to the voltage supply (Vdd) of the PMOS device. In some embodiments, the isolation structure 144a (shown in FIG. 3K) is the N-type MOS device, and the isolation lines 206 is electrically connected to the ground potential (GND) of the NMOS device.

The ROM cell array 100 includes four bit cell regions 52, 54, 56 and 58. The first bit cell region 52 includes two word lines 204 (also called WL-Y+3 and WL-Y+2), half of the isolation line 206 which is above the word line WL-Y+3, and half of the isolation line 206 which is below the word line WL-Y+2. The second bit cell region 54 includes two word lines 204 (also called WL-Y and WL-Y+1), half of the isolation line 206 which is above the word line WL-Y, and half of the isolation line 206 which is below the word line WL-Y+1. The isolation transistors 21, 23, 25, which remain at all times in the "off" state, are provided between the transistors in two adjacent bit cell regions to reduce leakage current there-between.

As shown in FIG. 2, the isolation line 206 is formed between the first group of word lines 204 in the first bit cell region 52 and the second group of word lines 204 in the second bit cell region 54. The word lines 204 and the isolation line 206 are formed in the same metal layer, such as second metal layer ($M_2$). The bit lines 212 and $V_{SS}$ lines 214 are formed in the first metal layer ($M_1$) below the second metal layer ($M_2$). The bit lines 212 in the first metal layer ($M_1$) are connected to the word lines 204 in the second metal layer ($M_2$) through via 116.

FIGS. 3A-3K show cross-sectional representations of various stages of forming read-only memory (ROM) cell array 100 shown in FIG. 2, in accordance with some embodiments of the disclosure. FIG. 3A is a cross-sectional representation along the line AA' in FIG. 2.

As shown in FIG. 3A, an active region 104 is formed over the substrate 102. The active region 104 is formed from the substrate 102 and may have N-type conductivity or P-type conductivity.

Instead of using the STI isolation structure, the isolation transistors 21, 23, 25 are configured to provide isolation between adjacent transistors. Accordingly, the active region 104 eliminates the use of an STI isolation structure between two transistor device structures. The active region 104 includes the first bit cell region 52 and the second bit cell region 54. A number of dummy gate structures 106 are formed over the active region 104. In some embodiments, the dummy gate structures 106 are made of polysilicon.

Figure 3B:
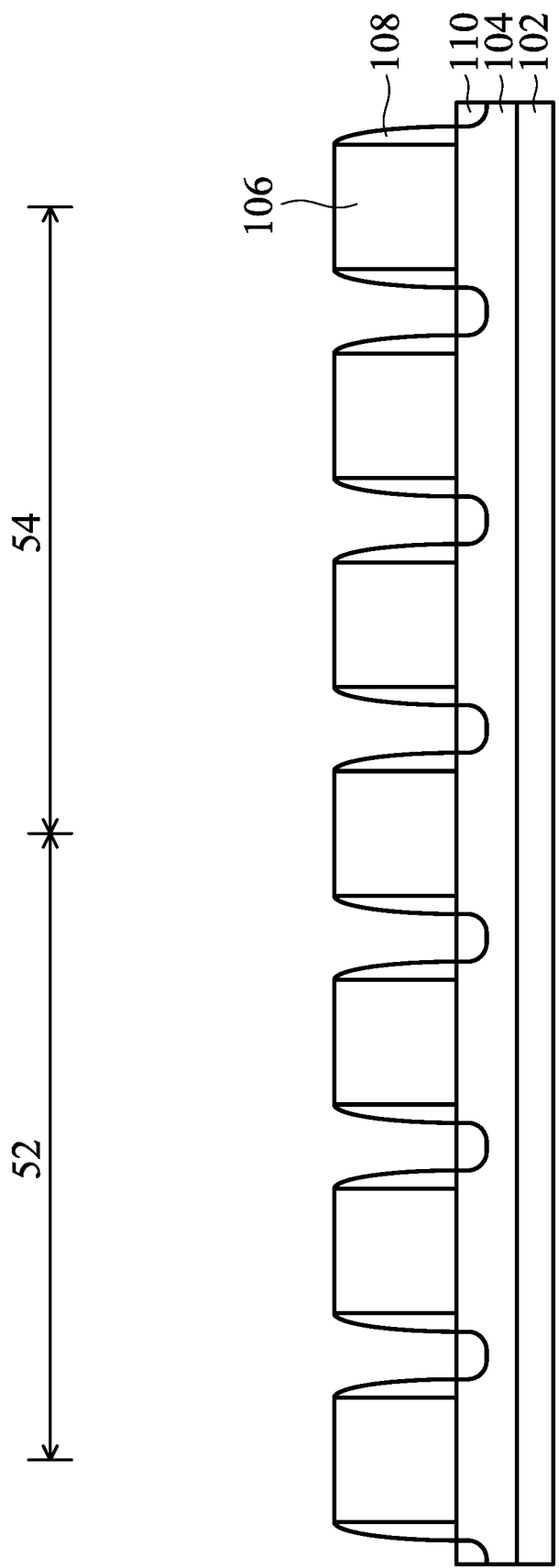

After the dummy gate structures 106 are formed, spacers 108 are formed over the opposite sidewalls of the dummy gate structures 106, as shown in FIG. 3B in accordance with some embodiments of the disclosure. The spacers 108 may be a single layer or multiple layers. The spacers 108 are formed by deposition processes, such as a chemical vapor deposition (CVD) process, high-density plasma chemical vapor deposition (HDPCVD) process, spin-on process, sputtering process, or another applicable process.

Afterwards, the source/drain (S/D) structures 110 are formed in the active region 104. In some embodiments, the source/drain (S/D) structures 110 are epitaxial structures and they are formed by an epitaxial (epi) process. In some embodiments, the source/drain (S/D) structures 110 include Ge, SiGe, InAs, InGaAs, InSb, GaAs, GaSb, InAlP, InP, or the like.

Figure 3C:
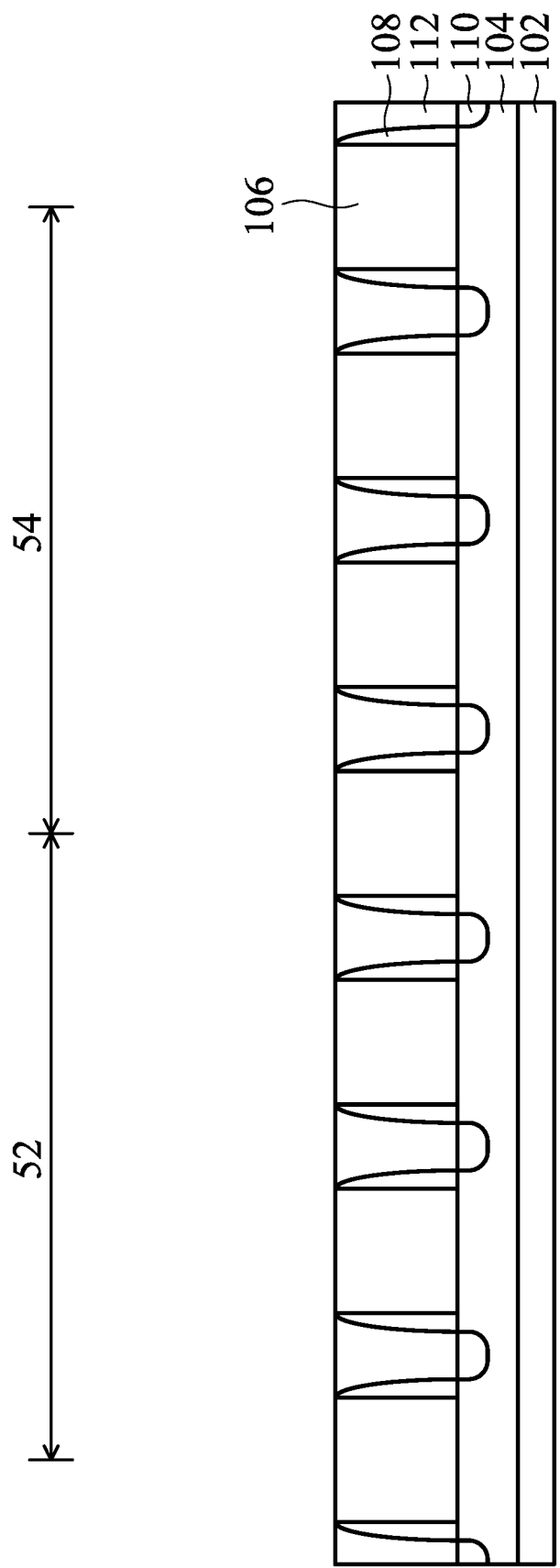

After the source/drain (S/D) structures 110 are formed, an inter-layer dielectric (ILD) structure 112 is formed over the dummy gate structures 106 and the active region 104, as shown in FIG. 3C in accordance with some embodiments of the disclosure.

The ILD structure 112 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

The ILD material 112 is formed by a deposition process, such as chemical vapor deposition (CVD), physical vapor deposition, (PVD), atomic layer deposition (ALD), spin-on coating, or another applicable process. Afterwards, a polishing process is performed to the ILD structure 112 until the top surfaces of the dummy gate structures 106 are exposed. In some embodiments, the ILD structure 112 is planarized by a chemical mechanical polishing (CMP) process.

Figure 3D:
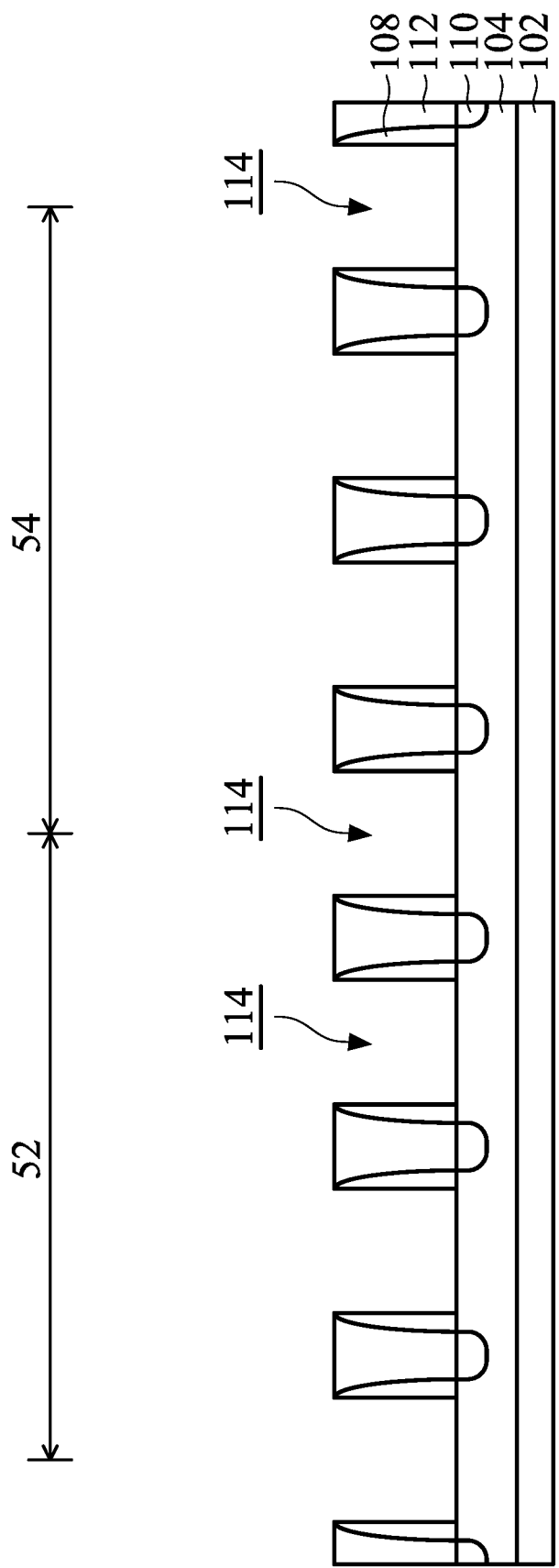

Afterwards, the dummy gate structures 106 are removed to form a number of trenches 114, as shown in FIG. 3D in accordance with some embodiments of the disclosure. In some embodiments, the dummy gate structures 106 are removed by a wet etching process or a dry etching process.

Figure 3E:
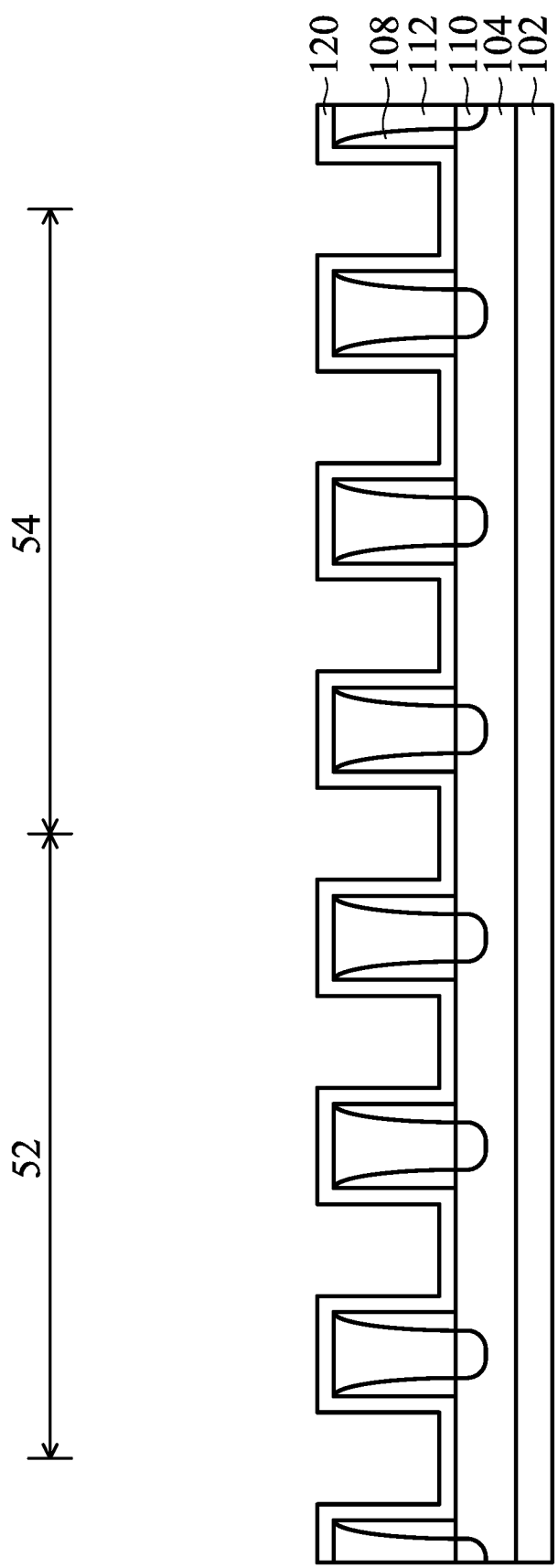

Afterwards, a gate dielectric layer 120 is conformally formed in the trench 114 as shown in FIG. 3E, in accordance with some embodiments. More specifically, the gate dielectric layer 120 is formed over bottom surfaces and sidewalls of the trenches 114, and over the inter-layer dielectric (ILD) structure 112.

The gate dielectric layer 120 may be a single layer or multiple layers. The gate dielectric layer 120 is made of silicon oxide (SiOx), silicon nitride (SixNy), silicon oxynitride (SiON), dielectric material(s) with high dielectric constant (high-k), a combination thereof, or other suitable material. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or a combination thereof, or other suitable material.

Figure 3F:
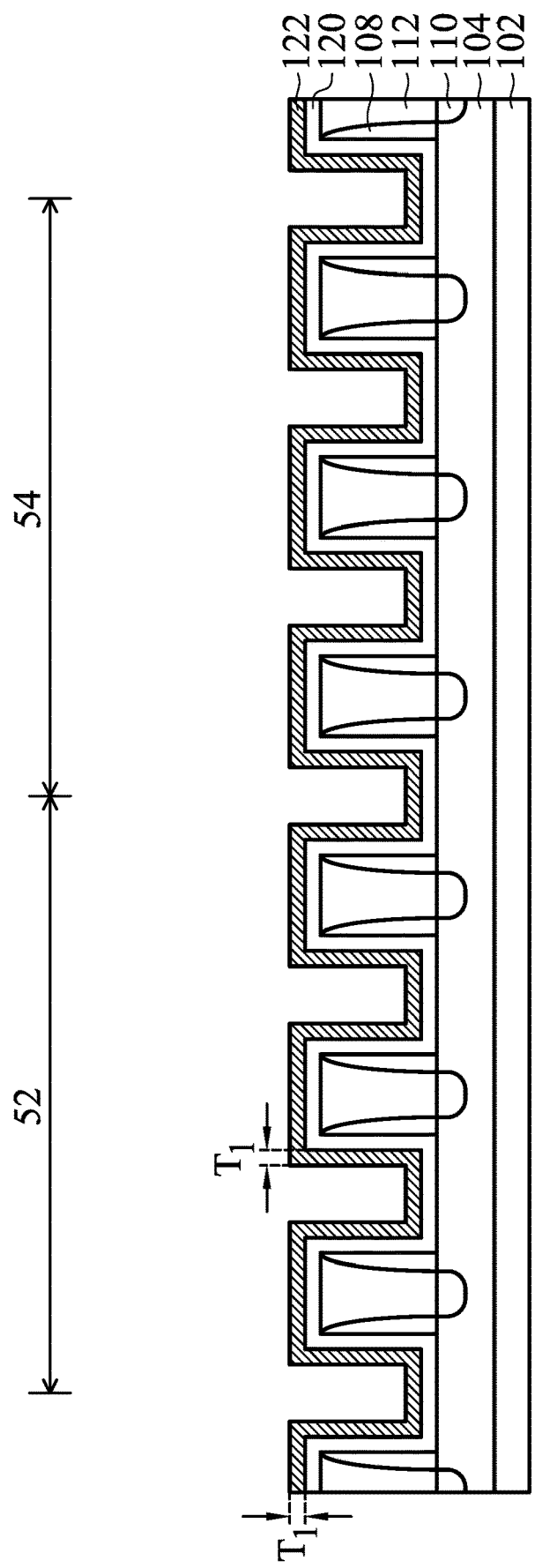

Afterwards, a first material 122 is conformally formed in the trench 114 and over the gate dielectric layer 120, as shown in FIG. 3F, in accordance with some embodiments. The first material 122 is configured to adjust the work function value of the gate structure of the transistor device. The thickness of the work function layer affects the threshold voltage (Vth) of the transistor. In some embodiments, when a PMOSFET device with a thinner work function layer is used as the isolation structure, the PMOSFET device may exhibit a higher threshold voltage. In other embodiments, when the NMOSFET device with thicker work function layer is used as the isolation structure, the NMOSFET device will have a higher threshold voltage.

In some embodiments, the first material 122 is made of P-type conductivity materials including titanium nitride (TiN), tantalum nitride (TaN), ruthenium (Ru), molybdenum (Mo), aluminum (Al), tungsten nitride (WN), zirconium disilicide (ZrSi$_2$), molybdenum disilicide (MoSi$_2$), tantalum silicide (TaSi$_2$), nickel silicide (NiSi$_2$), other suitable p-type work function materials, or a combination thereof, or other suitable material. In some other embodiments, the first material 122 is made of N-type conductivity materials including titanium (Ti), silver (Ag), tantalum aluminum (TaAl), tantalum aluminum carbide (TaAlC), titanium aluminum nitride (TiAlN), tantalum carbide (TaC), tantalum carbide nitride (TaCN), tantalum silicon nitride (TaSiN), manganese (Mn), zirconium (Zr), other suitable n-type work function materials, or a combination thereof, or other suitable material.

In some embodiments, the first material 122 is formed by a deposition process, such as chemical vapor deposition (CVD), physical vapor deposition, (PVD), atomic layer deposition (ALD), spin-on coating, or another applicable process. In some embodiments, the first material 122 has a first thickness $T_1$.

Figure 3G:
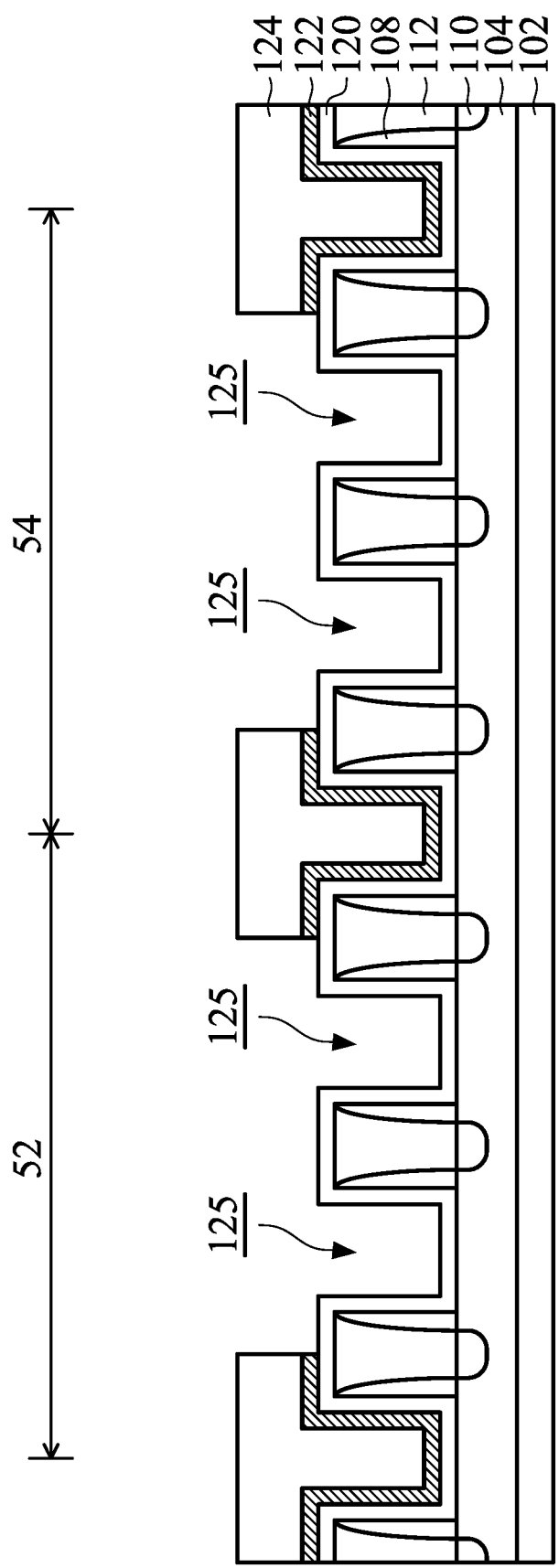

After the first material 122 is formed, a mask 124 is disposed on the first material 122 and patterned to form a patterned mask 124 covering a portion of the first material 122, as shown in FIG. 3G, in accordance with some embodiments. The mask 124 is configured to protect the underlying layers from being removed by the subsequent processes. Afterwards, a portion of the first material 122 is selectively removed to expose the trenches 125. In some embodiments, the portion of the first material 122 is removed by a dry etching process or a wet etching process.

Figure 3H:
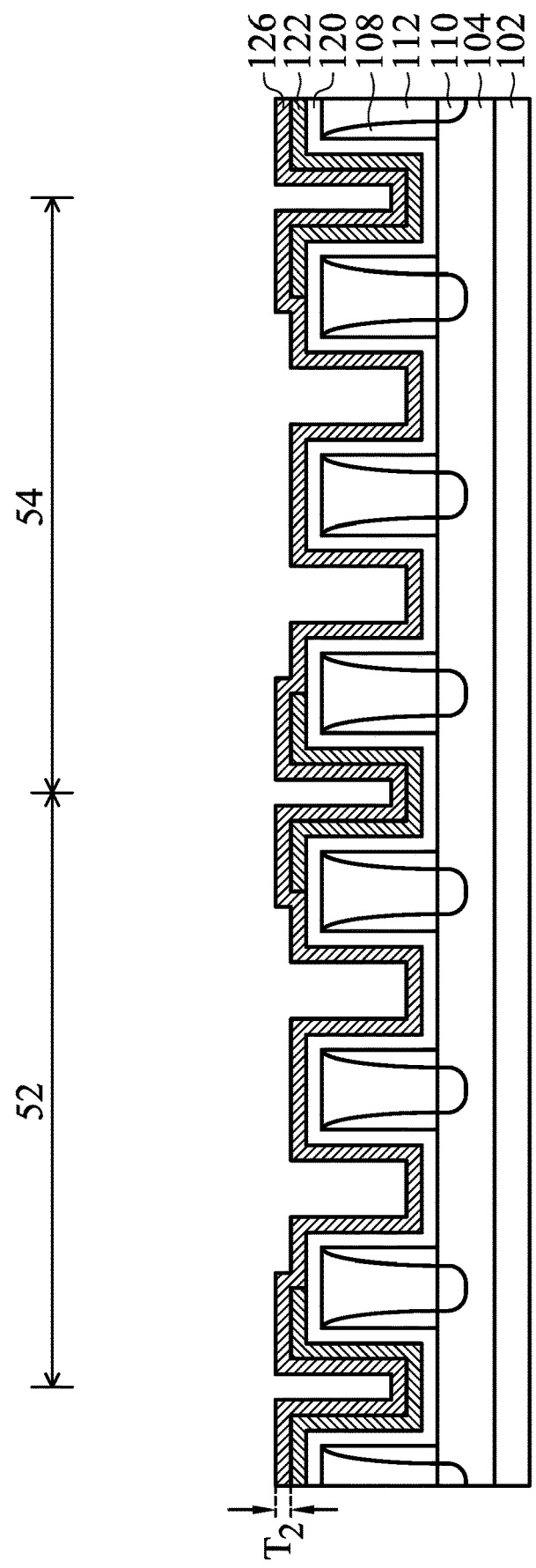

Afterwards, the mask 124 is removed, and a second material 126 is formed over the first material 122 and in the trenches 125, as shown in FIG. 3H, in accordance with some embodiments. The first material 122 is different from the second material 126. The second material 126 is also configured to adjust the work function value of the gate structure of the transistor device.

In some embodiments, the second material 126 is made of P-type conductivity materials including titanium nitride (TiN), tantalum nitride (TaN), ruthenium (Ru), molybdenum (Mo), aluminum (Al), tungsten nitride (WN), zirconium disilicide (ZrSi$_2$), molybdenum disilicide (MoSi$_2$), tantalum silicide (TaSi$_2$), nickel silicide (NiSi$_2$), other suitable p-type work function materials, or a combination thereof, or other suitable material. In some other embodiments, the second material 126 is made of N-type conductivity materials including titanium (Ti), silver (Ag), tantalum aluminum (TaAl), tantalum aluminum carbide (TaAlC), titanium aluminum nitride (TiAlN), tantalum carbide (TaC), tantalum carbide nitride (TaCN), tantalum silicon nitride (TaSiN), manganese (Mn), zirconium (Zr), other suitable n-type work function materials, or a combination thereof, or other suitable material. In some embodiments, the second material 126 has a second thickness $T_2$.

Figure 3I:
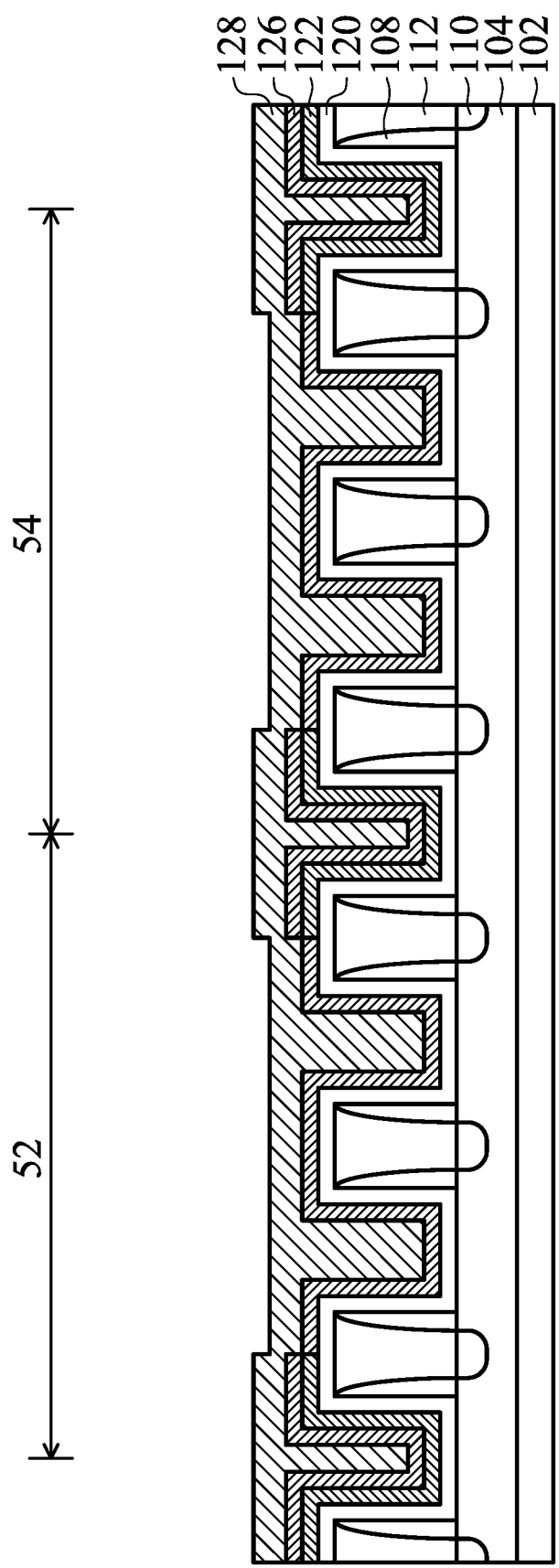

After the second material 126 is formed, a metal gate electrode layer 128 is formed over the second material 126, as shown in FIG. 3I, in accordance with some embodiments.

In some embodiments, the metal gate electrode layer 128 is made of conductive material, such as aluminum (Al), copper (Cu), tungsten (W), titanium (Ti), tantalum (Ta), or another applicable material. The metal gate electrode layer 128 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 3J:
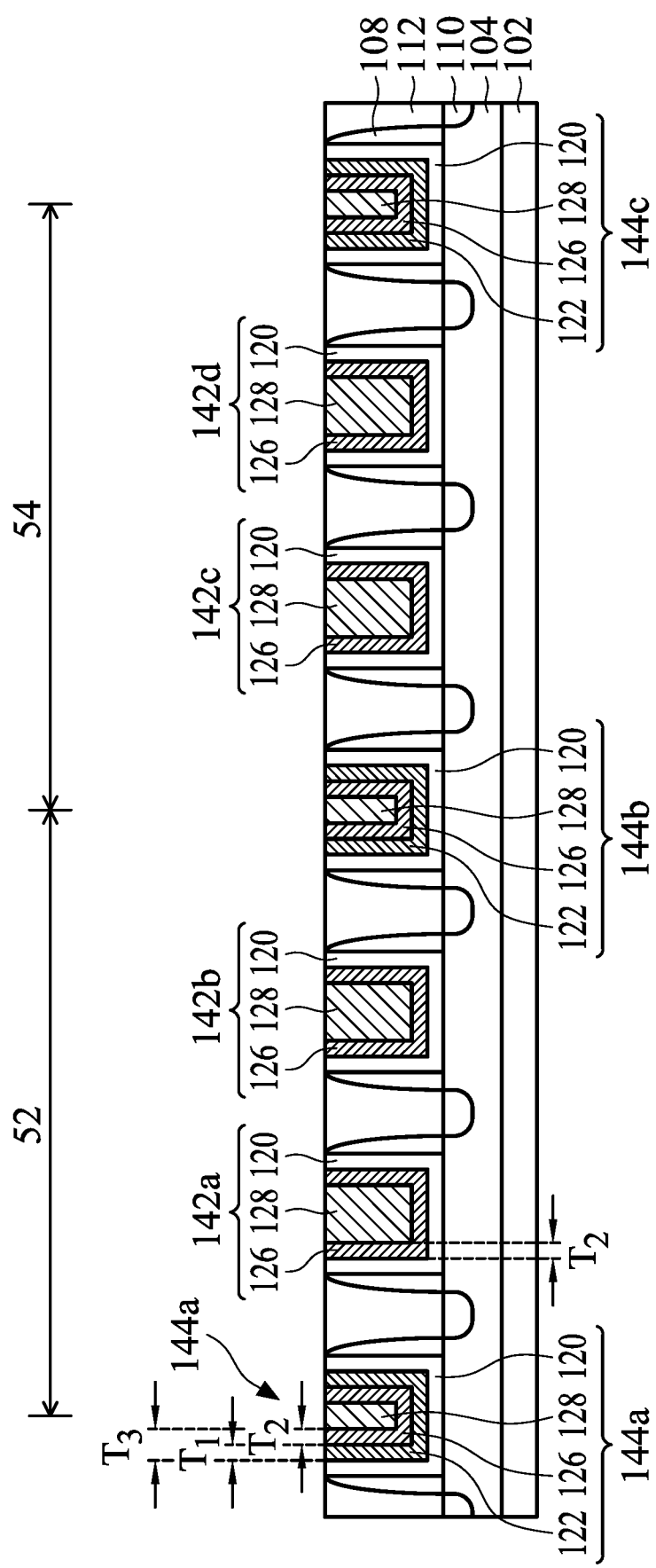

Afterwards, the excess metal gate electrode materials are removed by a polishing process, as shown in FIG. 3J, in accordance with some embodiments. As a result, the top surface of the metal gate electrode layer 128 and the top surface of the ILD structure 112 are exposed. In other words, the top surface of the metal gate electrode layer 128 is planar with the top surface of the ILD structure 112. In some embodiments, the polishing process is a chemical mechanical polishing (CMP) process.

As shown in FIG. 3J, a first gate structure 142a and a second gate structure 142b are formed in the first bit cell region 52, and the third gate structure 142c and the fourth gate structure 142d are formed in the second bit cell region 54. A first isolation structure 144a is adjacent to the first gate structure 142a. A second isolation structure 144b is formed between the second gate structure 142b and the third gate structure 142c. A third isolation structure 144c is formed adjacent to the fourth gate structure 142d.

The first group of gate structures including at least two gate structures 142a, 142b is formed in the first bit cell region 52, and the second group of gate structures including at least two gate structures 142a, 142b is formed in the second bit cell region 54. The isolation structure 144b is formed between the first group of gate structures and the second group of gate structures.

It should be noted that the gate structures 142a, 142b, 142c and 142d are functional or operational gate structures, but the isolation structures 144a, 144b and 144c are dummy structures which do not perform any function. As mentioned above, the isolation structures 144a, 144b, and 144c controlled by the isolation lines 206 (shown in FIG. 2) remain at all times in the "off" state. The isolation structures 144a, 144b and 144c are electrically connected to the isolation lines 206, and remain at all times in the "off" state.

Half of the second isolation structure 144b belongs to the first bit cell region 52, and half of the second isolation structure 144b belongs to the second bit cell region 54. In other words, the second isolation structure 144b is at the boundary between the first bit cell region 52 and the second bit cell region 54.

The first gate structure 142a includes the gate dielectric layer 120, the first work function layer made of the second material 126 and the metal gate electrode layer 128. The first isolation structure 144a includes the gate dielectric layer 120, the second work function layer made of the first material 122 and the second material 126, and the metal gate electrode layer 128. Therefore, the first work function layer of the first gate structure 142a has a thickness $T_2$, and the second work function layer of the first isolation structure 144a has a sum thickness $T_3$ of the first thickness $T_1$ and the second thickness $T_2$. The sum thickness $T_3$ is larger than the thickness $T_2$.

In some embodiments, the first work function layer of the first gate structure 142a is made of the second material 126, and therefore the first gate structure 142a has a first-type conductivity. The second work function layer of the first isolation structure 144a is made of the first material 122 and the second material 126, and therefore the first isolation structure 144a has a second-type conductivity opposite to the first-type conductivity. In some embodiments, the first work function layer of the first gate structure 142a is N-type transistor, and the second work function layer of the first isolation structure 144a is P-type transistor.

It should be noted that the threshold voltage (Vth) difference between the first isolation structure 144a and the first gate structure 142a is caused by the thickness difference ($\Delta T=T_3-T_2$) between the work function layer of the first isolation structure 144a and the work function layer of the first gate structure 142a. The advantage of the threshold voltage (Vth) difference is that the leakage current between two gate structures in adjacent bit cell regions may be reduced. In other words, the work function value of the gate structure is affected by changing the thickness of the work function layer. The threshold voltage (Vth) is affected by the work function value. Therefore, the threshold voltage (Vth) is affected by changing the thickness of the work function layer of the gate structure. In addition, the leakage current is reduced when the transistor has a higher threshold voltage (Vth). Accordingly, when the isolation structure 114a has a higher threshold voltage (Vth) than the adjacent first gate structure 142a, the leakage current is reduced by the isolation structure 114a. Therefore, the performance of the gate structure is improved when the leakage current is reduced.

In some embodiments, the thickness difference ($\Delta T=T_3-T_2$) is in a range from about 1 nm to 3 nm. If the thickness difference $\Delta T$ is smaller than 1 nm, the leakage current suppression effect is not good enough. If the thickness difference $\Delta T$ is greater than 3 nm, the metal gate electrode layer 128 is hardly to filled into the trench which is used to form the gate structure.

In some embodiments, the threshold voltage (Vth) difference is in a range from about 100 mV to about 500 mV. If the threshold voltage (Vth) difference is smaller than 100 mV, the leakage current suppression effect is not good enough. If the threshold voltage (Vth) difference is greater than 500 mV, the performance of the gate structures may suffer.

Figure 3K:
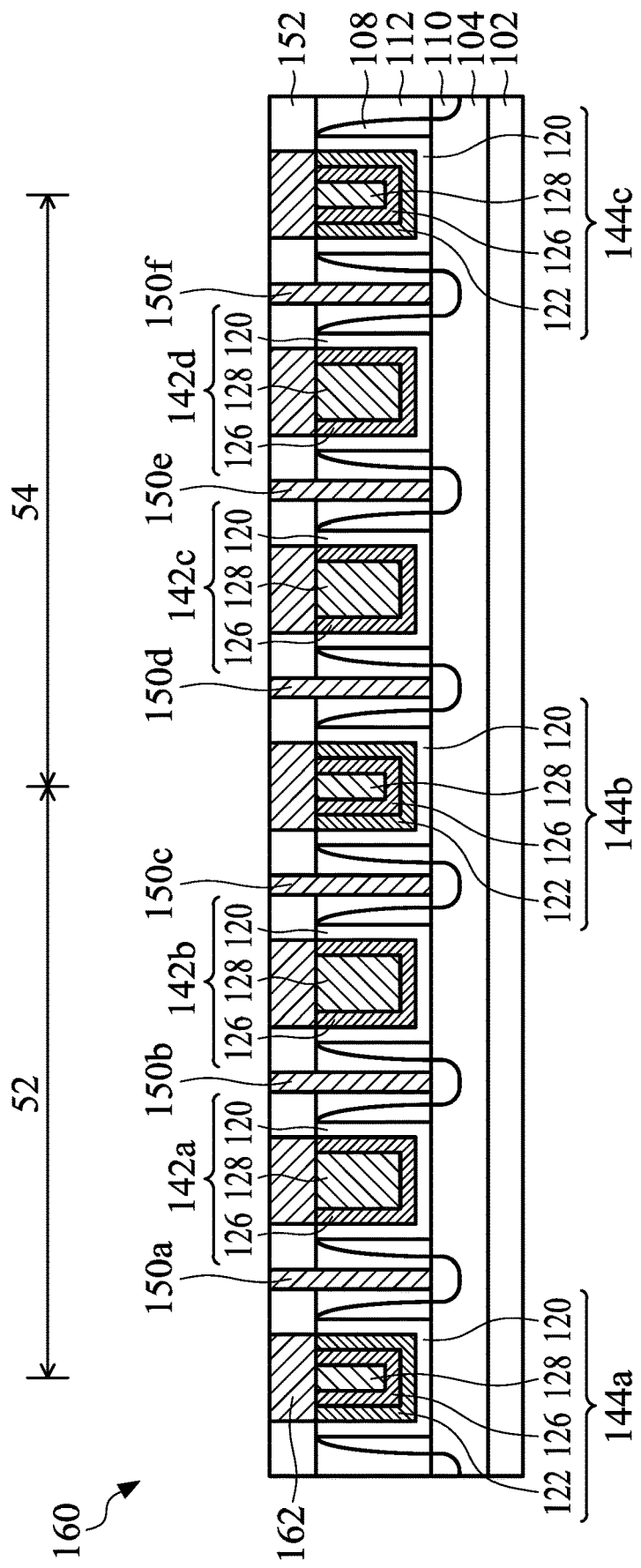

After the polishing process, an interconnect structure 160 is formed over the gate structures 142a, 142b, 142c and 142d, and the isolation structures 144a, 144b and 144c, as shown in FIG. 3K, in accordance with some embodiments. A dielectric layer 152 is formed over the gate structures 142a, 142b, 142c and 142d, and the isolation structures 144a, 144b, 144c. The contact structures 150a, 150b, 150c, 150d, 150e, 150f are formed through the dielectric layer 152 and the ILD structure 112. The vias 162 are formed over the top surfaces of the gate structures 142a, 142b, 142c and 142d, and the top surfaces of the isolation structures 144a, 144b, 144c.

The contact structures 150a, 150b, 150c, 150d, 150e, 150f are electrically connected to the S/D structure 110 in the active region 104. The top surface of the contact structures 150a, 150b, 150c, 150d, 150e, 150f are higher than the top surface of the gate structures 142a, 142b, 142c and 142d.

The first contact structure 150a, the second contact structure 150b and the third contact structure 150c are formed in the first bit cell region 52, and the second contact structure 150b is formed between the first contact structure 150a and the third contact structure 150c. The fourth contact structure 150d, the fifth contact structure 150e and the sixth contact structure 150f are formed in the second bit cell region 54, and the fifth contact structure 150e is formed between the fourth contact structure 150d and the sixth contact structure 150f.

The first contact structure 150a is formed between the first isolation structure 144a and the first gate structure 142a. In some embodiments, the first contact structure 150a is electrically connected to the bit lines 212 (shown in FIG. 2). The third contact structure 150c is formed between the second gate structure 142b and the second isolation structure 144b. In some embodiments, the third contact structure 150c is electrically connected to the bit lines 212 (shown in FIG. 2).

The second contact structure 150b is formed between the first gate structure 142a and the second gate structure 142b. In some embodiments, the second contact structure 150b is electrically connected to the ground potential (Vss). The second contact structure 150b is configured to isolate the first gate structure 142a and the second gate structure 142b.

The fourth contact structure 150d is electrically connected to the bit lines 212 (shown in FIG. 2). The fifth contact structure 150e is electrically connected to the ground potential (Vss). The sixth contact structure 150f is electrically connected to the bit lines 212 (shown in FIG. 2).

Figure 3L:
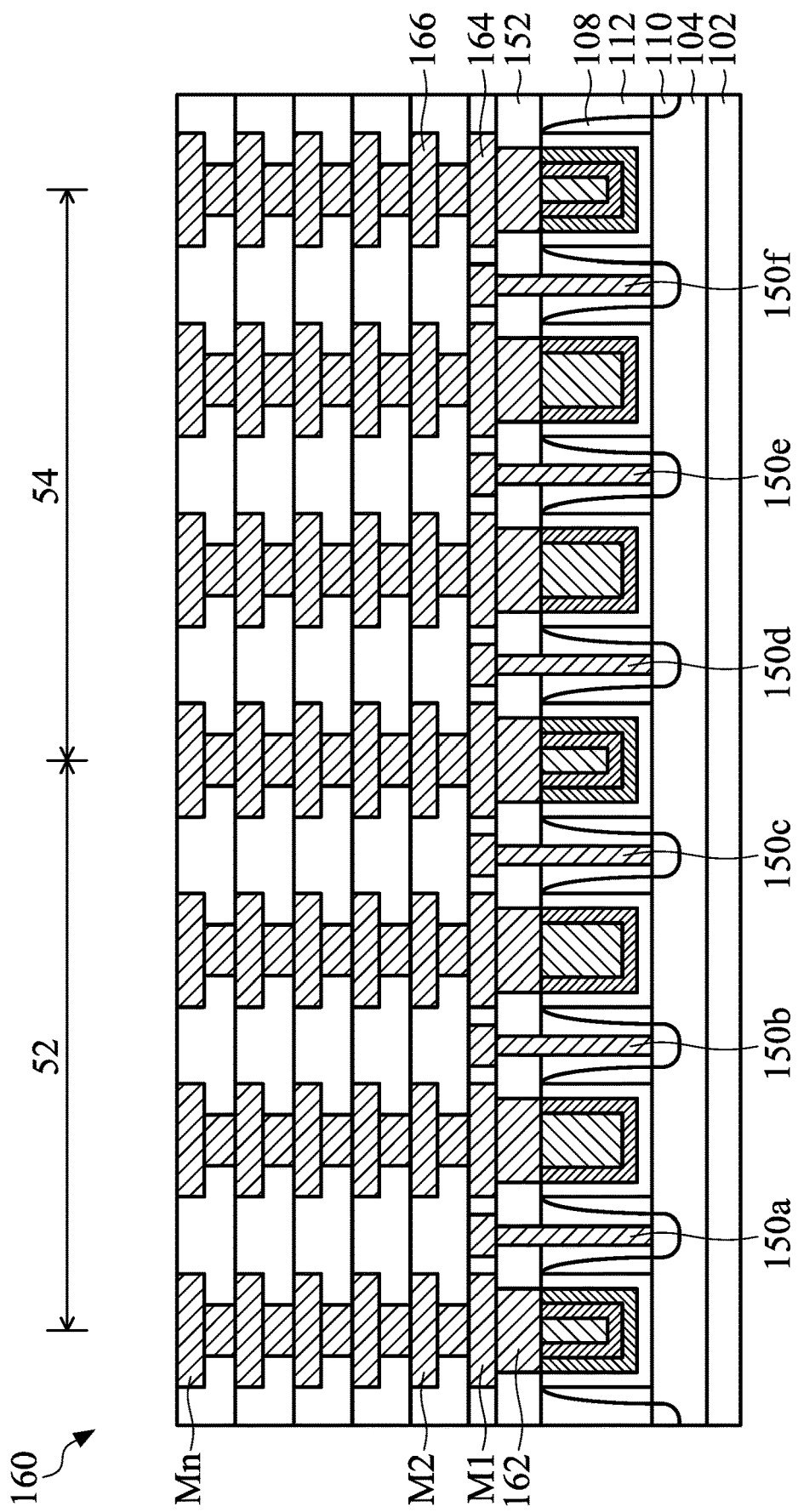

Afterwards, the first metal layer 164, the second metal layer 166 and the vias 162 are formed over the contact structures 150a, 150b, 150c, 150d, 150e, 150f a and over the gate structures 142a, 142b, 142c and 142d, and the isolation structures 144a, 144b, 144c, as shown in in FIG. 3L, in accordance with some embodiments.

The interconnect structure 160 includes the first metal layer 164, the second metal layer 166 and vias 162 formed in a dielectric layer 170. In some embodiments, the first metal layer 164, the second metal layer 166 and vias 162 are made of conductive materials, such as copper (Cu), copper alloy, aluminum (Al), aluminum alloys or a combination thereof, or other suitable material. In some embodiments, the first metal layer 164, the second metal layer 166 and vias 162 are copper (Cu) or copper alloy. In some embodiments, the interconnect structure 160 is formed in a back-end-of-line (BEOL) process. In some embodiments, the first metal layer 164, the second metal layer 166 and vias 162 are formed by single and/or dual damascene processes. The metal layers 164, 166 include multiple metal layers (namely $M_1$, $M_2$, $M_3$ . . . , and Mtop) which are interconnected through vias 162.

It should be noted that in some embodiments, the bit lines 212 and the $V_{SS}$ lines 214 (shown in FIG. 2) are formed in the first metal layer ($M_1$) 164. The word lines 204 and the isolation lines 206 are formed in the second metal layer ($M_2$) 166.

The metal routings of the conductive features as shown in FIG. 3L, are merely examples. Alternatively, other designs of metal routings of conductive features may be used according to actual application.

Figure 4A:
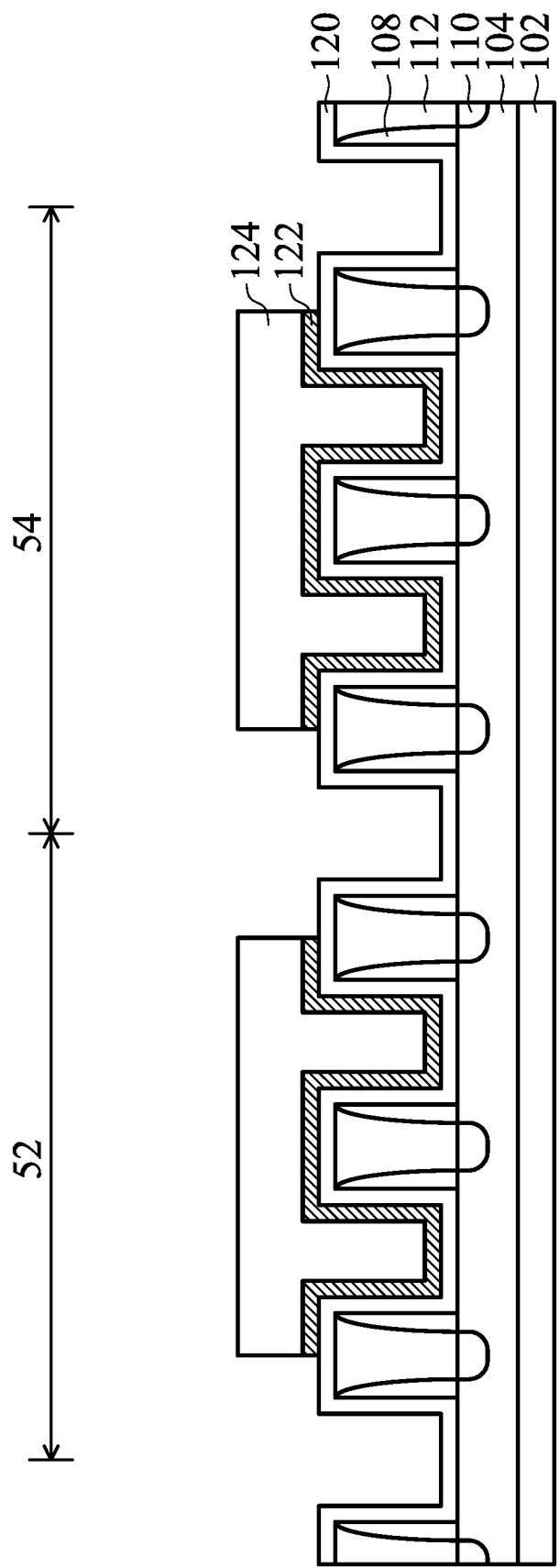
FIGS. 4A-4D show cross-sectional representations of various stages of forming read-only memory (ROM) cell array shown in FIG. 2, in accordance with some embodiments of the disclosure.

FIGS. 4A-4D show cross-sectional representations of various stages of forming the read-only memory (ROM) cell array 100 shown in FIG. 2, in accordance with alternative embodiments in accordance with the instant disclosure. FIG. 4A is a cross-sectional representation along the line AA' in FIG. 2. Processes and materials used to form the ROM device structure in FIGS. 3A-3L may be similar to, or the same as, those used to form the ROM device structure in FIGS. 4A-4D and are not repeated herein.

As shown in FIG. 4A, the mask layer 124 is formed over a portion of the first material 122. Afterwards, a portion of the first material 122 which is not protected by the mask layer 124 is removed by an etching process.

Figure 4B:
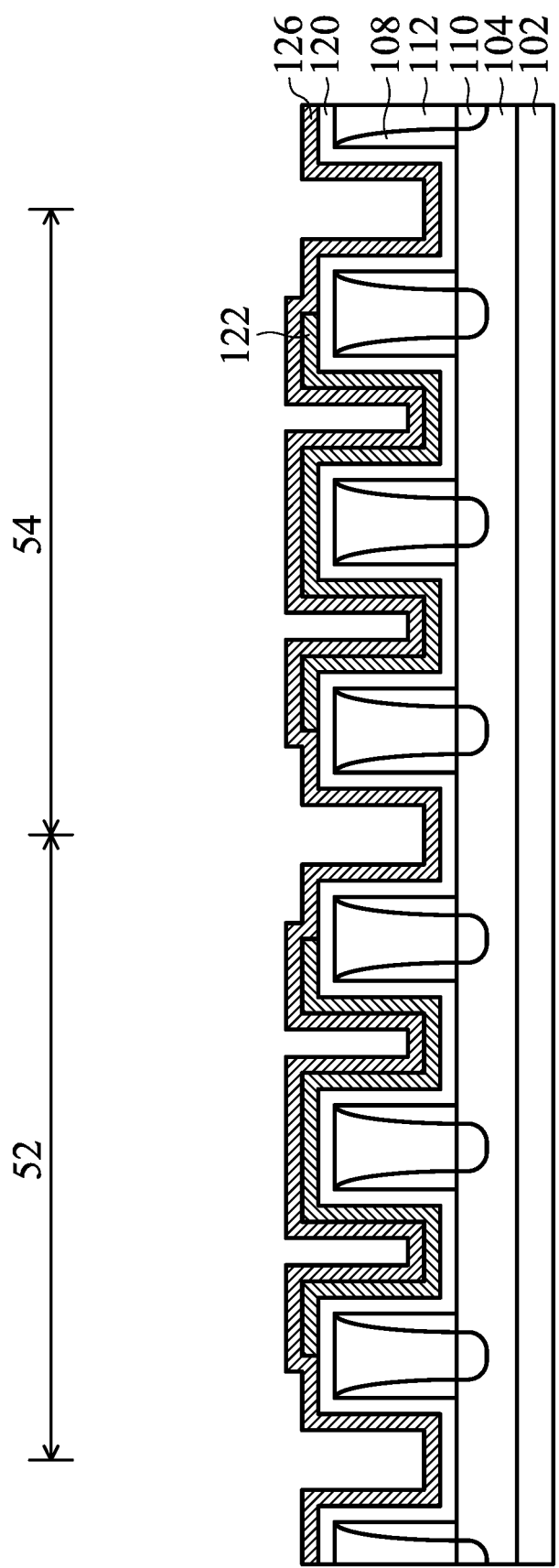

Afterwards, the mask layer 124 is removed, and the second material 126 is formed over the first material 122 and the gate dielectric layer 120, as shown in in FIG. 4B, in accordance with some embodiments.

Figure 4C:
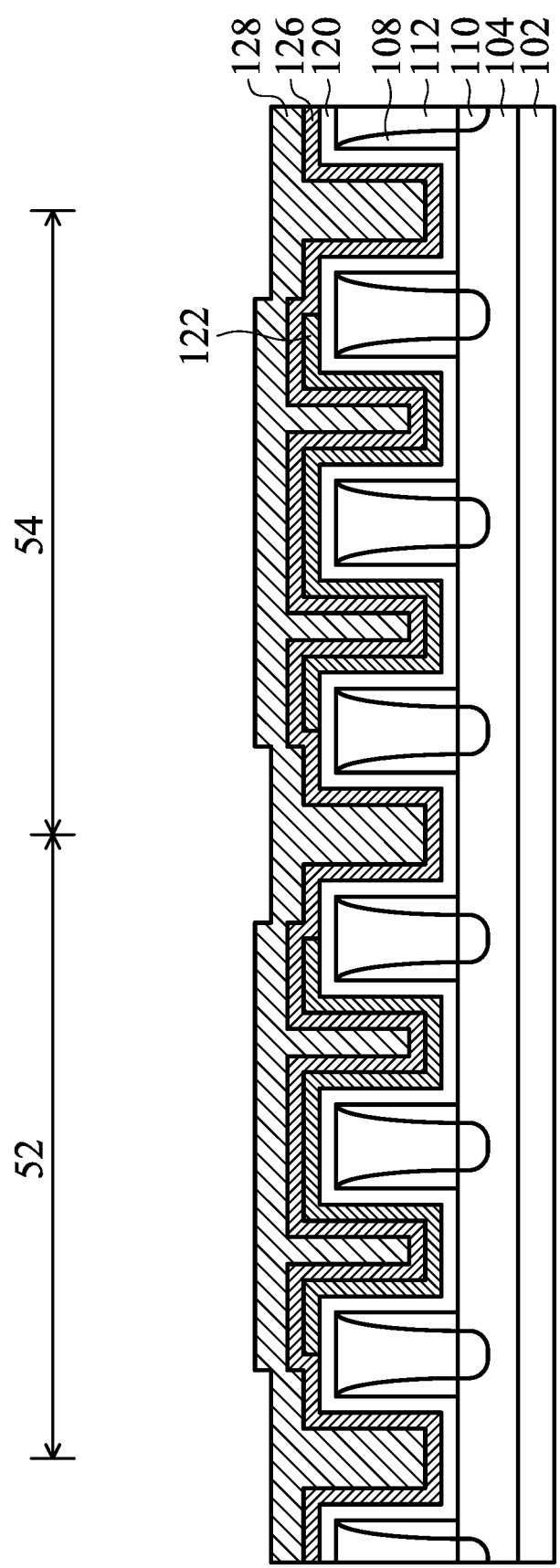

After the second material 126 is formed, the metal gate electrode layer 128 is formed over the second material 126, as shown in FIG. 4C, in accordance with some embodiments.

Figure 4D:
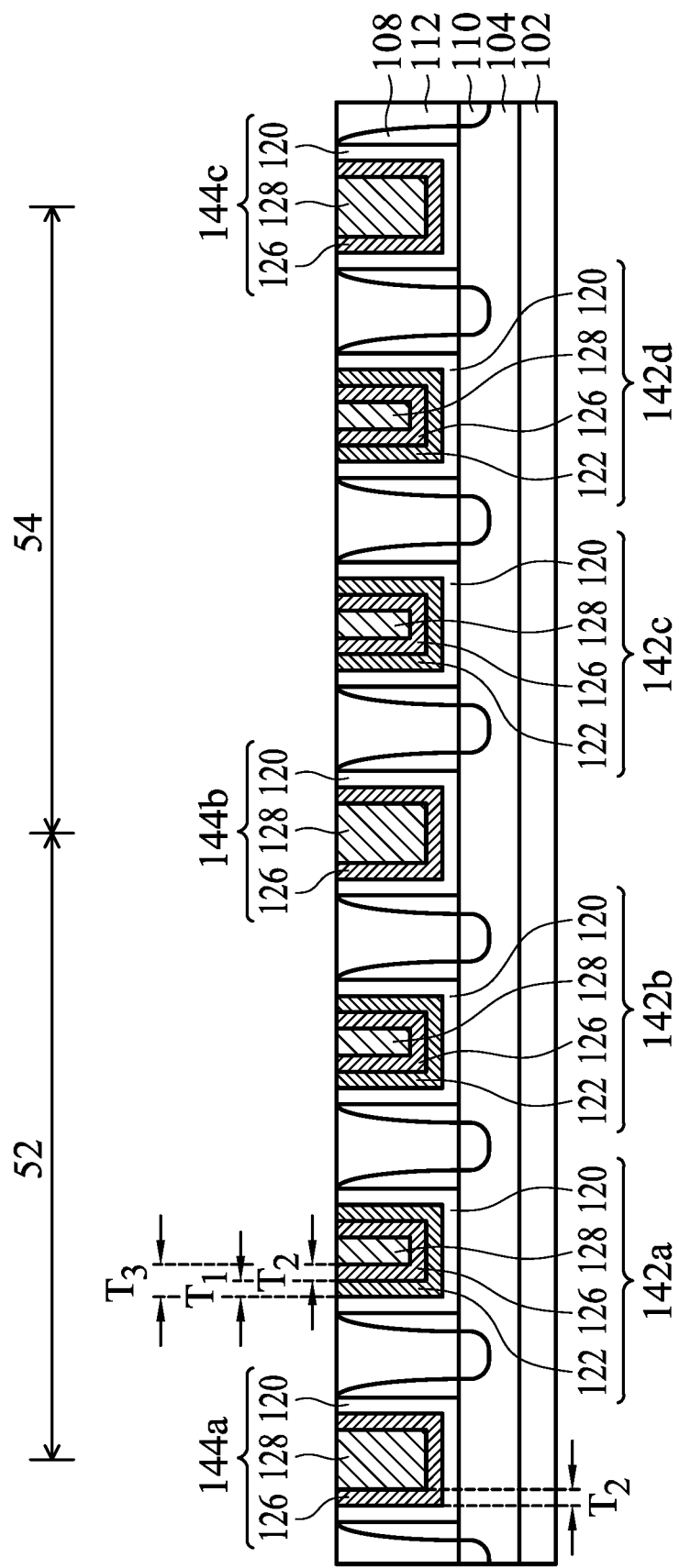

Afterwards, the first gate structure 142a and the second gate structure 142b are formed in the first bit cell region 52, and the third gate structure 142c and the fourth gate structure 142d are formed in the second bit cell region 54, as shown in FIG. 4D, in accordance with some embodiments. The first isolation structure 144a is adjacent to the first gate structure 142a. The second isolation structure 144b is formed between the second gate structure 142b and the third gate structure 142c.

It should be noted that the first work function layer of the first gate structure 142a has a sum thickness $T_3$ which is the sum of the first thickness $T_1$ and the second thickness $T_2$. The second work function layer of the first isolation structure 144a has a thickness $T_2$. The ROM device structure has leakage current suppression function by forming the thickness difference between the gate structure and the isolation structure.

Embodiments for a read-only memory (ROM) device structure and method for formation the same are provided. The ROM device structure includes an isolation structure between two groups of gate structures. The isolation structure is configured to isolate a first group of gate structures and a second group of gate structures. A threshold voltage (Vth) difference between the gate structure and the isolation structure is caused by forming the thickness difference between a thickness of a work function layer of the gate structure and that of a work function layer of the isolation structure. The isolation structure with a higher threshold voltage (Vth) has a relatively lower leakage current. Accordingly, the leakage current is suppressed by adjusting the thickness difference of the gate structure and the isolation structure, and therefore the performance of the ROM device structure is improved.

In some embodiments, a read-only memory (ROM) device structure is provided. The ROM device structure includes a first gate structure formed over a substrate, and the first gate structure comprises a first work function layer with a first thickness. The ROM device structure includes an isolation structure formed over the substrate, and the isolation structure is adjacent to the first gate structure. The isolation structure includes a second work function layer with a second thickness, and the second thickness is larger than or smaller than the first thickness. The ROM device structure also includes a first contact structure formed over the substrate, and the first contact structure is between the first gate structure and the isolation structure.

In some embodiments, a read-only memory (ROM) device structure is provided. The ROM device structure includes an active region over a substrate and a first gate structure formed on the active region. The first gate structure includes a first work function layer with a first-type conductivity. The ROM device structure includes a first isolation structure formed over the active region, and the first isolation structure comprises a second work function layer with a second-type conductivity. The first-type conductivity is different from the second-type conductivity. The ROM device structure further includes a second isolation structure formed over the active region, wherein the first gate structure is between the first isolation structure and the second isolation structure.

In some embodiments, a read-only memory (ROM) device structure is provided. The ROM device structure includes an active region formed over a substrate and at least two gate structures formed over the active region. Each of the gate structures includes a first work function layer, and the first work function layer comprises a first material. The ROM device structure also includes an isolation structure formed over the active region, wherein the isolation structure comprises a second work function layer, and the first work function layer includes the first material and a second material, the second material is different from the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A read-only memory (ROM) device structure, comprising:

a first gate structure formed over a substrate, wherein the first gate structure comprises a first work function layer with a first thickness;

an isolation structure formed over the substrate, wherein the isolation structure is adjacent to the first gate structure, wherein the isolation structure comprises a second work function layer with a second thickness and a gate electrode layer, and the second thickness is larger than the first thickness, and there is a vertical interface between the gate electrode layer and the second work function layer; and a first contact structure formed over the substrate, wherein the first contact structure is between the first gate structure and the isolation structure.

2. The read-only memory (ROM) device structure as claimed in claim 1, further comprising:

an interconnect structure formed over the first gate structure, the second gate structure and the isolation structure, wherein the interconnect structure comprises:

a first metal layer formed over the first gate structure, wherein the first contact structure is electrically connected to the first metal layer; and a second metal layer formed over the first metal layer, wherein the first gate structure is electrically connected to the second metal layer.

3. The read-only memory (ROM) device structure as claimed in claim 1, wherein the first work function layer has a first-type conductivity, and the second work function layer has a second-type conductivity.

4. The read-only memory (ROM) device structure as claimed in claim 1, wherein the substrate comprises an active region, and the active region is a continuous active region which is extending under the first gate structure, the second gate structure and the isolation structure.

5. The read-only memory (ROM) device structure as claimed in claim 1, further comprising:

a second gate structure formed over the substrate; and a second contact structure formed over the substrate, wherein the second contact structure is between the first gate structure and the second gate structure.

6. The read-only memory (ROM) device structure as claimed in claim 1, wherein the isolation structure is electrically connected to a ground potential (GND) or a voltage supply (Vdd).

7. The read-only memory (ROM) device structure as claimed in claim 1, wherein the first contact structure is electrically connected to a voltage supply (Vdd).

8. The read-only memory (ROM) device structure as claimed in claim 1, wherein a top surface of the first contact structure is higher than a top surface of the first gate structure.

9. The read-only memory (ROM) device structure as claimed in claim 1, further comprising:

a third contact structure formed over the substrate, wherein the first gate structure is formed between the first contact structure and the third contact structure, the third contact structure is electrically connected to a ground potential (GND).

10. The read-only memory (ROM) device structure as claimed in claim 1, further comprising:

a source/drain (S/D) structure formed in the substrate and directly below the first contact structure, wherein the S/D structure is between the first gate structure and the isolation structure.

11. A read-only memory (ROM) device structure, comprising:

an active region over a substrate;

a first gate structure formed on the active region, wherein the first gate structure comprises a first work function layer with a first-type conductivity;

a second gate structure formed on the active region, wherein the second gate structure comprises the first work function layer with the first-type conductivity;

a first isolation structure formed over the active region, wherein the first isolation structure comprises a second work function layer with a second-type conductivity, wherein the first-type conductivity is different from the second-type conductivity; and a second isolation structure formed over the active region, wherein the first gate structure is between the first isolation structure and the second isolation structure, and the first gate structure and the second gate structure are between the first isolation structure and the second isolation structure.

12. The read-only memory (ROM) device structure as claimed in claim 11, further comprising:

a first contact structure formed over the active region, wherein the first contact structure is adjacent to the first gate structure, and the first contact structure is electrically connected to a ground potential (GND).

13. The read-only memory (ROM) device structure as claimed in claim 12, further comprising:

a second contact structure formed over the active region, wherein the second contact structure is between the first isolation structure and the second isolation structure.

14. The read-only memory (ROM) device structure as claimed in claim 13, wherein the second contact structure is electrically connected to a voltage supply (Vdd).

15. The read-only memory (ROM) device structure as claimed in claim 11, wherein the first isolation structure is electrically connected to a ground potential (GND) or a voltage supply (Vdd).

16. The read-only memory (ROM) device structure as claimed in claim 11, wherein a half portion of the first isolation structure and the first gate structure are in a bit-cell region.

17. The read-only memory (ROM) device structure as claimed in claim 11, wherein the first work function layer has a first thickness, the second work function layer has a second thickness, the first thickness is larger than the second thickness.

18. A read-only memory (ROM) device structure, comprising:

an active region formed over a substrate;

an isolation structure formed over the active region, wherein the isolation structure comprises a first material, a second material on the first material and a gate electrode layer, the second material is different from the first material, sidewall surfaces and a bottom surface of the gate electrode layer are in direct contact with the second material; and at least two gate structures formed over the active region, wherein each of the gate structures comprises the second material.

19. The read-only memory (ROM) device structure as claimed in claim 18, wherein the first material has a first-type conductivity, and the second material has a second-type conductivity, wherein the first-type conductivity is different from the second-type conductivity.

20. The read-only memory (ROM) device structure as claimed in claim 18, further comprising: a first contact structure formed over the substrate, wherein the first contact structure is between the gate structures and the first isolation structure, and a bottom surface of the first contact structure is lower than a bottom surface of the first material.

\* \* \* \* \*